United States Patent
Kobinata et al.

(10) Patent No.: US 6,921,922 B2
(45) Date of Patent: Jul. 26, 2005

(54) OPTICAL COMMUNICATION MODULE

(75) Inventors: Katsumi Kobinata, Tokyo (JP); Yoshiki Furukawa, Tokyo (JP); Takahiko Nozaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 31 days.

(21) Appl. No.: 10/658,980

(22) Filed: Sep. 10, 2003

(65) Prior Publication Data

US 2004/0240773 A1 Dec. 2, 2004

(30) Foreign Application Priority Data

Jun. 2, 2003 (JP) ........................................ 2003-156945

(51) Int. Cl.$^7$ ............................................ H01L 29/267
(52) U.S. Cl. ............................ 257/81; 257/82; 257/83
(58) Field of Search ............................. 257/81–83, 700, 257/703, 704–705, 712, 664, 98; 385/14, 92, 49

(56) References Cited

U.S. PATENT DOCUMENTS

| | | | | |
|---|---|---|---|---|
| 6,271,579 B1 | * | 8/2001 | Going et al. | 257/664 |
| 6,548,895 B1 | * | 4/2003 | Benavides et al. | 257/712 |
| 6,574,399 B2 | * | 6/2003 | Boudreau et al. | 385/49 |
| 6,627,987 B1 | * | 9/2003 | Glenn et al. | 257/704 |
| 6,646,290 B1 | * | 11/2003 | Lee et al. | 257/81 |
| 6,752,539 B2 | * | 6/2004 | Colgan et al. | 385/92 |
| 6,759,740 B2 | * | 7/2004 | Onitani et al. | 257/705 |
| 6,815,729 B1 | * | 11/2004 | Brophy et al. | 257/98 |
| 6,835,960 B2 | * | 12/2004 | Lin et al. | 257/81 |
| 2003/0231840 A1 | * | 12/2003 | Okada et al. | 385/92 |

* cited by examiner

Primary Examiner—Frank G. Font
Assistant Examiner—Michael P. Mooney
(74) Attorney, Agent, or Firm—Weingarten, Schurgin, Gagnebin & Lebovici LLP

(57) ABSTRACT

A substrate (2) is composed of laminated green sheets. The substrate (2) is provided with recesses (2f, 2g) formed on at least two locations deeper than implemented heights of ICs (4, 6) and elements (3, 5). A transmitter and a receiver are mounted in different recesses, which are individually covered with a mold resin to form a molded optical communication module (1), which operates fast and causes no optical and electrical crosstalk.

8 Claims, 1 Drawing Sheet

OPTICAL COMMUNICATION MODULE

BACKGROUND OF THE INVENTION

1. Field of the Invention

The present invention relates to an optical communication module for use in optical communications as a transmitter or a receiver. More particularly, it relates to a configuration of an optical communication module capable of extending a frequency band to further improve a communication rate and of elevating an S/N ratio to improve a communication quality in the optical communication module.

2. Description of the Related Art

In a conventional optical communication module, a light-emitter and a photodetector may be mounted on a substrate. For example, the light-emitter and the photodetector are mounted on one surface of a multi-layered printed-circuit board, and signal processing ICs for the light-emitter and the photodetector are mounted on the rear surface of the same multi-layered printed-circuit board. (For example, see Japanese Patent Application Laid-Open No. 2002-296435, paragraphs 0021-0078, FIG. 1).

If the light-emitter and the photodetector are mounted on the printed circuit board so as to project from the surface of the board, a light emitted from the light-emitter may easily reach around to the photodetector, causing so-called crosstalk, which lowers the S/N ratio and deteriorates the communication quality disadvantageously. In order to prevent the communication quality from such deteriorating, a half-duplex system is required because it is not operative to receive during the light-emitting element is driven to transmit. This system, however, results in extreme loss of convenience.

An excellent high frequency characteristic can not be expected from the printed circuit board that includes the light-emitter, the photodetector and their associated circuits mounted thereon. In addition, such the board has a limit in high-speed signaling. Therefore, even if high-speed elements of light-emitter and photodetector are applied for transmitting and receiving, their effect can not be exhibited sufficiently. Consequently, the communication rate of the optical communication module suffers some constraint about the characteristic of the printed circuit board.

SUMMARY OF THE INVENTION

Accordingly, it is an object of the present invention to provide a configuration of an optical communication module capable of extending a frequency band to further improve a communication rate and of elevating an S/N ratio to improve a communication quality in the optical communication module.

As a specific means for solving the above conventional subject, the present invention provides an optical communication module, which comprises a substrate; a transmitter comprising a light-emitter element and a driver IC operative to drive said light-emitter; a receiver comprising a photodetector element and an amplifier IC operative to amplify an output signal from the photodetector; and circuit components accompanied with the transmitter and receiver. The transmitter, receiver and circuit componernts are implemented on the substrate. The substrate comprises a ceramic substrate made of laminated green sheets and at least two recesses formed thereon and the light-emitting element and photodetector element are mounted into the separate recesses and are separately covered with a mold resin by molding. Each depth of said recess formed is deeper than the mounted heights of the light-emitter or photodetector elements mounted thereinto. A color of the ceramic substrate is preferably white. In the preferable optical communication module, the recesses include a recess exclusive for the light-emitter element and a recess exclusive for the photodetector element, each exclusive recess formed in a tapered shape with a conical horn within a range of a depth roughly corresponding to that of the mounted heights of the elements, and the elements mounted in the exclusive recess is separately covered with a transparent resin. Such covering in the recess is molded by means of a potting mold method using a dispenser.

BRIEF DESCRIPTION OF THE DRAWINGS

The present invention will be more fully understood from the following detailed description with reference to the accompanying drawings, in which:

FIG. 4 is a cross-sectional view showing formation of a protection film in the same embodiment; and FIG. 5 is a perspective view showing the major part of another embodiment of the optical communication module similarly according to the present invention.

DETAILED DESCRIPTION OF THE PREFERRED EMBODIMENTS

Figure 1:
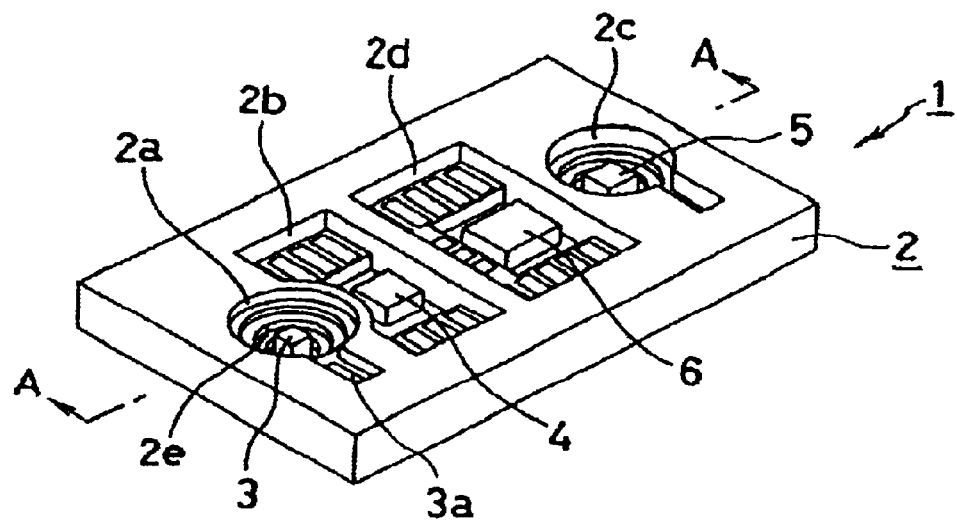
FIG. 1 is a partly omitted perspective view showing an embodiment of the optical communication module according to the present invention.
Figure 2:
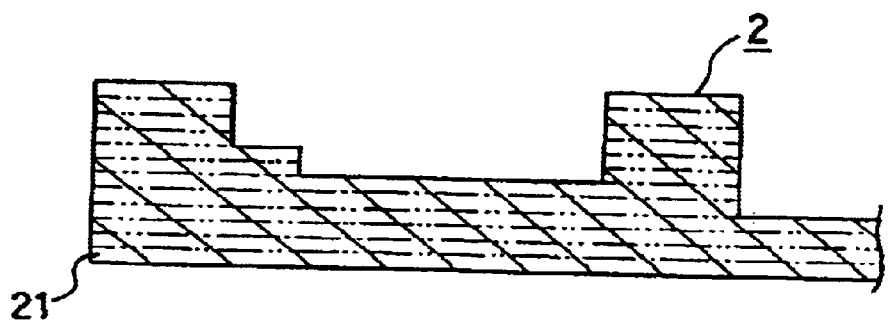
FIG. 2 is an enlarged cross-sectional view of the major part of the same embodiment.
Figure 3:
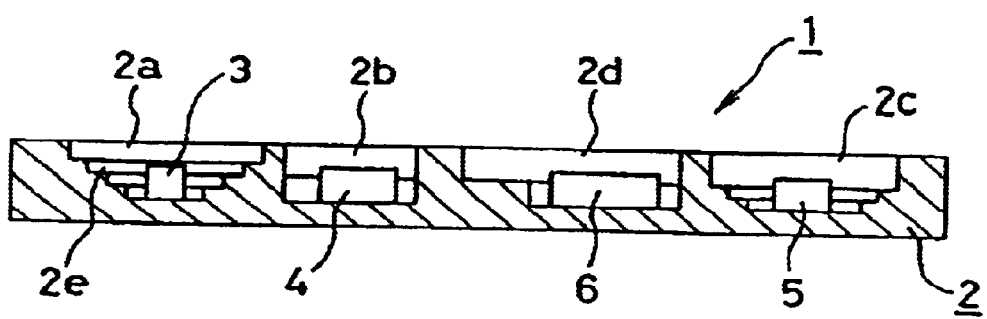
FIG. 3 is a cross-sectional view taken along the A—A line in FIG. 1.

The present invention will be described next with reference to the drawings. In FIGS. 1–4, the reference numeral 1 denotes an optical communication module according to the present invention. The optical communication module 1 includes a substrate 2, which comprises a ceramic substrate made of green sheets 21 laminated and sintered. The green sheets 21 are processed for opening of apertures and printing of conductors corresponding to locations to be laminated as shown in the FIG. 2 with the major part enlarged.

In the present embodiment, the substrate 2 has four recesses formed therein. A light-emitter housing recess 2a is formed to house a light-emitter 3. A driver IC housing recess 2b is formed to house a driver IC 4 operative to drive the light-emitter 3. A photodetector housing recess 2c is formed to house a photodetector 5. An amplifier IC housing recess 2d is formed to house an amplifier IC 6 operative to amplify a signal from the photodetector 5.

The following description is given to the recesses 2a–2d with respect to their depths to be set. The light-emitter housing recess 2a has a depth deeper than the mounted height of the light-emitter 3 housed in the recess 2a. Similarly, the driver IC housing recess 2b has a depth deeper than the mounted height of the driver IC 4. The photodetector housing recess 2c has a depth deeper than the mounted height (implemented height) of the photodetector 5. The amplifier IC housing recess 2d has a depth deeper than the mounted height of the amplifier IC 6 (see FIG. 3).

In addition, the present invention utilizes the fact that the substrate 2 is made by the lamination of green sheets. A tapered portion 2e shaped in a conical horn of approximately 45° is provided within a range roughly corresponding to the height of the light-emitter 3 in the light-emitter housing recess 2a. This portion is effective to allow a light emitted sideways from the light-emitter 3 to be reflected by the conical horn toward the front to increase a total amount of the light from the light-emitter 3.

A tapered portion 2e may also be formed in an appropriate location in the photodetector housing recess 2c, if required, to allow part of the received light, which otherwise does not reach the photodetector 5, to be reflected by the tapered portion toward the photodetector 5 to increase the signal intensity. Preferably, the green sheets become white after they are sintered as the substrate 2 because such the white sheets have high reflectance.

Depending on the case, for example, the transmitter side requires additional circuit components other than the driver IC 4, such as a resistor 3a for limiting current the light-emitter 3. Similarly, the receiver side may possibly require other circuit components than the photodetector 5 and the amplifier IC 6. When such additional circuit components are required, a recess is determined based on the group of transmitting or receiving, which they belong to. Then, the circuit components are housed in the recess to which the component belong to prevent crosstalk.

As described above, the light-emitter 3 is mounted in the light-emitter housing recess 2a, the driver IC 4 in the driver IC housing recess 2b, the photodetector 5 in the photodetector housing recess 2c, and the amplifier IC 6 in the amplifier IC housing recess 2d. Thereafter, as shown in FIG. 4, a liquid resin is potted into the recesses 2a–2d and cured to form a protective film 7 to protect the light-emitter 3, the photodetector 5, the driver IC 4 and the amplifier IC 6 from moisture, for example.

The potting of the liquid resin into the recesses 2a–2d is performed individually to each of the recesses 2a–2d using a dispenser, for example. It is required to inject a transparent resin into the light-emitter housing recess 2a and the photodetector housing recess 2c. In contrast, any transparent or opaque resin may be potted into the driver IC housing recess 2b and the amplifier IC housing recess 2d.

The amounts of the resin potted into the driver IC housing recess 2b and the amplifier IC housing recess 2d are appropriate if they are sufficient to cover the ICs 4 and 6 in the two recesses 2b and 2d, respectively. In contrast, as for the light-emitter housing recess 2a and the photodetector housing recess 2c, appropriately excess amounts of the resin are potted therein to swell and shape lenses. These lenses are effective to emit a beam of light from the light-emitter 3 and allow the received external light to be converged on the photodetector 5 (see FIG. 4).

Other configurations are freely applicable though they are not shown in the figures. For example, grounded conductive layers may be formed on the upper and lower surfaces of the green sheets between the driver IC housing recess 2b and the amplifier IC housing recess 2d. This configuration is effective to conduct the drive signal out of the driver IC 4 to the ground on the way and thereby prevent its leakage into the amplifier IC 6 to reduce the leakage.

The optical communication module 1 of the present invention thus configured has the following effect and operation, which are described next. First, the substrate 2 consists of a ceramic substrate. Accordingly, when the light-emitter 3 is driven at a high speed, a signal can be transmitted from external to the driver IC 4, then from the driver IC 4 to the light-emitter 3, without disadvantageous attenuation caused from lack of the frequency characteristic of the substrate 2. This is effective to achieve a high-speed optical communication module 1 of this type.

All the recesses 2a–2d such as the light-emitter housing recess 2a are determined to have depths deeper than the implemented heights of the respective elements and ICs mounted in the corresponding recesses. Accordingly, when these elements and ICs are covered with the mold resin to form the protective film 7, the light-emitter 3, the driver IC 4, the photodetector 5 and the amplifier IC 6 can be covered in the separate protective film 7, respectively.

This is effective to prevent the communication quality from deteriorating due to crosstalk between the light-emitter 3 and the photodetector 5, or between the elements, when the light from the light-emitter 3 at the transmitter side optically propagates through the protective film 7 and reaches the photodetector 5 at the receiver side. As the crosstalk from the transmitter side to the receiver side is prevented, a full-duplex communication capable of transmitting and receiving simultaneously can be applied to improve the communication efficiency.

In the case of the driver IC 4 and the amplifier IC 6, a relatively intensive signal from the driver IC 4 for driving the photodetector 5 electrically propagates through the protective film 7. Further, the propagating signal interferes with and gives loss of accuracy to an input signal to the amplifier IC 6, which is an extremely weak output from the photodetector 5. This interference can be prevented similarly.

FIG. 5 shows another embodiment of the optical communication module 1 according to the present invention. In the previous embodiment, the recesses are formed at the four locations in the substrate 2, including the light-emitter housing recess 2a, the driver IC housing recess 2b, the photodetector housing recess 2c and the amplifier IC housing recess 2d.

As obvious from the description of the previous embodiment, those that are not desirable to be housed in the same recess are the light-emitter 3 and the photodetector 5 which handle different signals, as well as the driver IC 4 and the amplifier IC 6. To the contrary, as for the light-emitter 3 and the driver IC 4 in combination which handle the same signal, as well as the photodetector 5 and the amplifier IC 6 in combination, it is considered less harmful practically if they are housed in the same recess.

Accordingly, in the present embodiment, the substrate 2 is provided with recesses formed in two locations, including a transmitter recess 2f for housing the light-emitter 3 and the driver IC 4 and a receiver recess 2g for housing the photodetector 5 and the amplifier IC 6. This is effective to halve the processes of potting the liquid mold resin down to two locations to form the protective film 7 (not shown in the figure) with appropriately possible cost down.

In accordance with the present invention, an optical communication module is provided as described above. It comprises a substrate; a transmitter comprising a light-emitter element and a driver IC operative to drive the light-emitter; a receiver comprising a photodetector element and an amplifier IC operative to amplify an output signal from the photodetector; and other associated circuit components assembled on the substrate together with the transmitter and the receiver. The substrate comprises a ceramic substrate made of laminated green sheets and having at least two recesses formed deeper than implemented heights of the ICs and elements. The transmitter and the receiver are mounted in the separate recesses and individually molded in a mold resin. First, the substrate is made of ceramic excellent in frequency characteristic. Accordingly, no attenuation is caused when a high-speed transmission signal is applied to the driver IC for the light-emitter and also when the signal received at the photodetector is transmitted to the amplifier IC for amplification. Therefore, it is possible to provide a high-speed optical communication module and exhibit an excellent effect on an improvement in performance.

Second, the substrate is processed into ceramic with lamination of green sheets. Accordingly, the recesses can be formed in the substrate with freely determinable depths. This is effective to design the recesses deeper than the implemented heights of the elements and ICs to eliminate the crosstalk due to optical and electrical leakage across from the light-emitter to the photodetector or from the driver IC to the amplifier IC. Therefore, it is possible to achieve a full-duplex communication with a high communication quality in the optical communication module of this type and exhibit an excellent effect on an improvement in performance with this regard.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. An optical communication module, comprising:
    a substrate;
    a transmitter comprising a light-emitter element and a driver IC operative to drive said light-emitter;
    a receiver comprising a photodetector element and an amplifier IC operative to amplify an output signal from said photodetector; and
    circuit components accompanied with said said transmitter and receiver;
    wherein said transmitter, receiver and circuit components are implemented on said substrate, wherein said substrate comprises a ceramic substrate made of laminated green sheets and at least two recesses formed thereon, and said light-emitting element and photodetector element are mounted into said separate recesses and said recesses are separately covered with a mold resin by molding, and wherein depths of said recesses formed are each deeper than a mounted height of said light-emitter or photodetector elements mounted thereinto.

2. The optical communication module according to claim 1, wherein a color of said ceramic substrate is white.

3. The optical communication module to claim 1, wherein said recesses include at least a recess exclusive for said light-emitter element and a recess exclusive for said photodetector element, each exclusive recess being formed in a tapered shape with a conical horn within a range of a depth roughly corresponding to that of the mounted heights of the elements, and said elements mounted in said exclusive recesses being separately covered with a transparent resin.

4. The optical communication module according to claim 1, wherein each covering in said recess is molded by means of a potting mold method using a dispenser.

5. The optical communication module to claim 2, wherein said recesses include at least a recess exclusive for said light-emitter element and a recess exclusive for said photodetector element, each exclusive recess being formed in a tapered shape with a conical horn within a range of a depth roughly corresponding to that of the mounted heights of the elements, and said elements mounted in said exclusive recesses being separately covered with a transparent resin.

6. The optical communication module according to claim 2, wherein each covering in said recess is molded by means of a potting mold method using a dispenser.

7. The optical communication module according to claim 3, wherein each covering in said recess is molded by means of a potting mold method using a dispenser.

8. The optical communication module to claim 2, wherein;
    said recesses include at least a recess exclusive for said light-emitter element and a recess exclusive for said photodetector element, each exclusive recess being formed in a tapered shape with a conical horn within a range of a depth roughly corresponding to that of the mounted heights of the elements, and said elements mounted in said exclusive recesses being separately covered with a transparent resin;
    each covering in said recess is molded by means of a potting mold method using a dispenser.

* * * * *